United States Patent
McKinzie, III

(10) Patent No.: US 7,123,118 B2
(45) Date of Patent: *Oct. 17, 2006

(54) SYSTEMS AND METHODS FOR BLOCKING MICROWAVE PROPAGATION IN PARALLEL PLATE STRUCTURES UTILIZING CLUSTER VIAS

(75) Inventor: William E. McKinzie, III, Fulton, MD (US)

(73) Assignee: Wemtec, Inc., Fulton, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/828,542

(22) Filed: Apr. 19, 2004

(65) Prior Publication Data

US 2006/0038639 A1    Feb. 23, 2006

Related U.S. Application Data

(63) Continuation-in-part of application No. 10/796,398, filed on Mar. 8, 2004.

(51) Int. Cl.
    H01P 7/00       (2006.01)
    H05K 7/00      (2006.01)
(52) U.S. Cl. ............. 333/219; 333/245; 333/247; 361/734
(58) Field of Classification Search .......... 333/24 C, 333/219, 245, 247; 361/763, 764, 821, 302, 361/306.2, 328, 782, 734
    See application file for complete search history.

(56) References Cited

U.S. PATENT DOCUMENTS

| | | | |
|---|---|---|---|
| 5,450,046 A | 9/1995 | Kosugi et al. | |
| 5,451,917 A * | 9/1995 | Yamamoto et al. | 333/246 |
| 5,886,597 A * | 3/1999 | Riad | 333/245 |
| 5,912,597 A | 6/1999 | Inagawa et al. | |
| 5,973,929 A * | 10/1999 | Arakawa et al. | 361/762 |
| 6,061,025 A | 5/2000 | Jackson et al. | |
| 6,075,485 A | 6/2000 | Lilly et al. | |
| 6,262,495 B1 | 7/2001 | Yablonovitch et al. | |
| 6,366,443 B1 | 4/2002 | Devoe et al. | |
| 6,411,261 B1 | 6/2002 | Lilly | |
| 6,476,771 B1 | 11/2002 | McKinzie, III | |
| 6,501,427 B1 | 12/2002 | Lilly et al. | |
| 6,512,494 B1 | 1/2003 | Diaz et al. | |
| 6,525,695 B1 | 2/2003 | McKinzie, III | |
| 6,538,538 B1 | 3/2003 | Hreish et al. | |
| 6,542,342 B1 | 4/2003 | Hayashi et al. | |
| 6,542,352 B1 * | 4/2003 | Devoe et al. | 361/321.2 |
| 6,567,048 B1 | 5/2003 | McKinzie et al. | |

(Continued)

OTHER PUBLICATIONS

International Search Report dated Apr. 19, 2005, for International Application No. PCT/US05/13235.

(Continued)

Primary Examiner—Seungsook Ham
(74) Attorney, Agent, or Firm—Heller Ehrman LLP

(57) ABSTRACT

Systems and methods are taught for blocking the propagation of electromagnetic waves in parallel-plate waveguide (PPW) structures. Periodic arrays of resonant vias are used to create broadband high frequency stop bands in the PPW, while permitting DC and low frequency waves to propagate. Particular embodiments include clusters of small vias that effectively function as one large via, thereby increasing stop band bandwidth and maximizing parallel plate capacitance. Cluster vias can be configured to additionally provide a shielded and impedance matched route within the interior area of the cluster through which signal vias can connect transmission lines disposed in planes lying above and below the PPW. Important applications include electromagnetic noise reduction in layered electronic devices such as circuit boards, ceramic modules, and semiconductor chips.

45 Claims, 16 Drawing Sheets

Plated through holes may be used in the fabrication of resonant vias as illustrated here for an internal I resonant via.

Examples of fundamental resonant cluster via types consisting of two or more vias connected in parallel.. Dielectric layers required for support are not shown.

U.S. PATENT DOCUMENTS

| | | | |
|---|---|---|---|
| 6,587,327 | B1 | 7/2003 | Devoe et al. |
| 6,590,531 | B1 | 7/2003 | McKinzie, III et al. |
| 6,646,605 | B1 | 11/2003 | McKinzie, III et al. |
| 6,670,932 | B1 | 12/2003 | Diaz et al. |
| 6,690,327 | B1 | 2/2004 | McKinzie, III et al. |
| 6,751,082 | B1 | 6/2004 | Devoe et al. |
| 6,753,218 | B1 | 6/2004 | Devoe et al. |
| 6,768,476 | B1 | 7/2004 | Lilly et al. |
| 6,774,866 | B1 | 8/2004 | McKinzie, III et al. |
| 6,774,867 | B1 | 8/2004 | Diaz et al. |
| 6,816,356 | B1 | 11/2004 | Devoe et al. |
| 6,831,602 | B1 | 12/2004 | McKinzie, III et al. |
| 6,867,746 | B1 | 3/2005 | Mendolia et al. |
| 6,888,316 | B1 | 5/2005 | Seo et al. |
| 6,897,831 | B1 | 5/2005 | McKinzie, III et al. |
| 6,906,674 | B1 | 6/2005 | McKinzie, III et al. |
| 6,917,343 | B1 | 7/2005 | Sanchez et al. |
| 6,933,895 | B1 | 8/2005 | Mendolia et al. |
| 6,937,192 | B1 | 8/2005 | Mendolia et al. |
| 6,970,341 | B1 | 11/2005 | Devoe et al. |
| 2002/0183013 | A1 | 12/2002 | Auckland et al. |
| 2003/0025637 | A1 | 2/2003 | Mendolia et al. |
| 2003/0043071 | A1 | 3/2003 | Lilly et al. |
| 2003/0071763 | A1 | 4/2003 | McKinzie, III et al. |
| 2003/0137457 | A1 | 7/2003 | McKinzie, III et al. |
| 2005/0029632 | A1 | 2/2005 | McKinzie, III et al. |
| 2005/0205292 | A1 | 9/2005 | Rogers et al. |
| 2005/0224912 | A1 | 10/2005 | Rogers et al. |

OTHER PUBLICATIONS

T. Lee, "A Vertical Leap for Microchips", Scientific American, Jan. 2002, pp. 52-59.

International Search Report dated Oct. 21, 2005, for International Application No. PCT/US05/06784.

Abhari et al., "Suppression of Parallel-Plate Noise in High Speed Circuits Using a Metallic Electromagnetic Band-Gap Structure", 2002 IEEE MTT-S Intl. Microwave Symp. Digest, pp. 493-496, Seattle, WA, Jun. 2-7, 2002.

Daniel R. Sievenpiper, "High-Impedance Electromagnetic Surfaces," dissertation, UCLA Electrical Engineering Dept., filed Jan. 1999.

Abhari et al., "Metallo-Dielectric Electromagnetic Bandgap Structures for Suppression and Isolation of the Parallel-Plate Noise in High Speed Circuits," IEEE Trans. MTT, vol. 51, No. 6, Jun. 2003.

Kamgaing et al., "High-Impedance Electromagnetic Surfaces for Parallel-Plate Mode Suppression in High Speed Digital Systems", IEEE 11th Topical Meeting on Electrical Performance of Electronic Packaging (EPEP), Monterey, CA, Oct. 21-23, 2002.

Kamgaing et al., "A Novel Power Plane with Integrated Simultaineous Switching Noise Mitigation Capability Using High Impedance Surface," IEEE Microwave and Wireless Components Letter, vol. 13, No. 1, Jan. 2003.

Kamgaing et al., "Inductance-Enhanced High-Impednace Surfaces for Broadband Simultaneous Switching Noise Mitigation in Power Planes," 2003 IEEE MTT-S Intl. Microwave Symp. Digest, pp. 2165-2168, Philadelphia, PA, Jun. 8-13, 2003.

Kamgaing et al., "Development and Application fo Physics-based Compact Models for High-Impedance Electromagnetic Surfaces Integrated in a Power Plane Configuration", IEEE Intl. Antennas and Propagation Symp., vol. 4, pp. 442-445, Columbus, OH, Jun. 22-27, 2003.

* cited by examiner

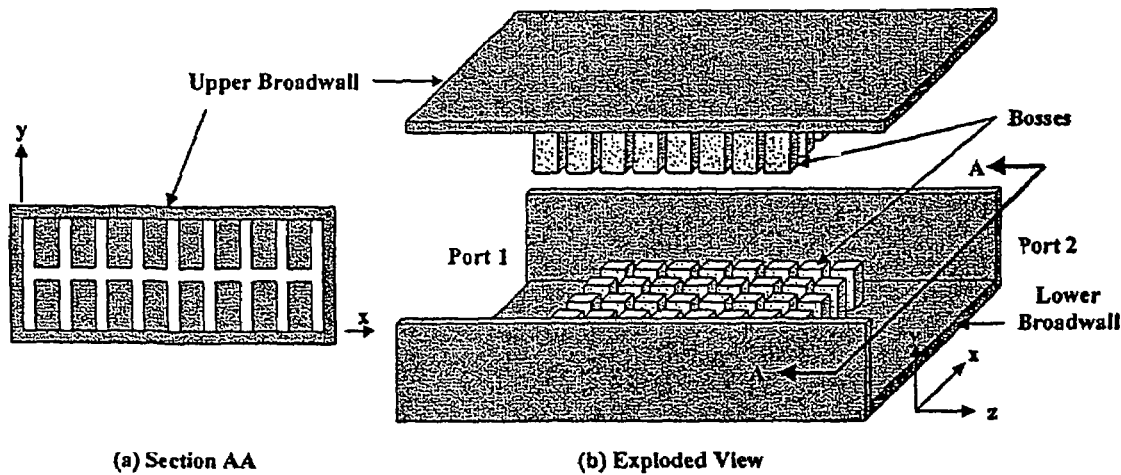
Waffle-Iron Waveguide Filter: (a) view looking into port 2, (b) exploded view.
Prior Art     FIG. 1
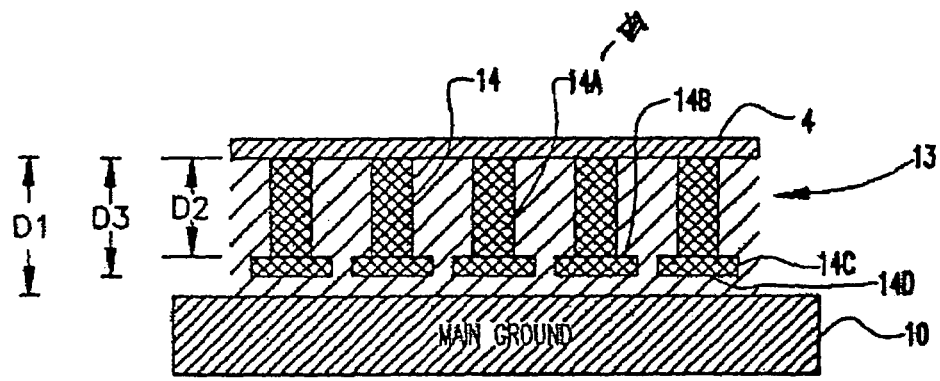
Examples of resonant vias from Riad's US patent 5,886,597.
Prior Art     FIG. 2
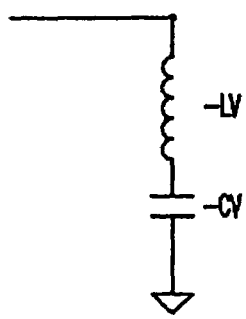
Prior Art     FIG. 3

| | Mechanically-Unbalanced | Mechanically-Balanced |
|---|---|---|
| Internal | Internal "T" <br> US Pat. 5,886,597 | Internal "double T" <br> US Pat. 6,542,342 <br><br> Internal "I" |
| External | External "T" <br> US Pat. 5,886,597 | External "I" |
| Hybrid | | Hybrid "I" |

Examples of resonant vias. Dielectric layers required for support are not shown.

FIG. 4

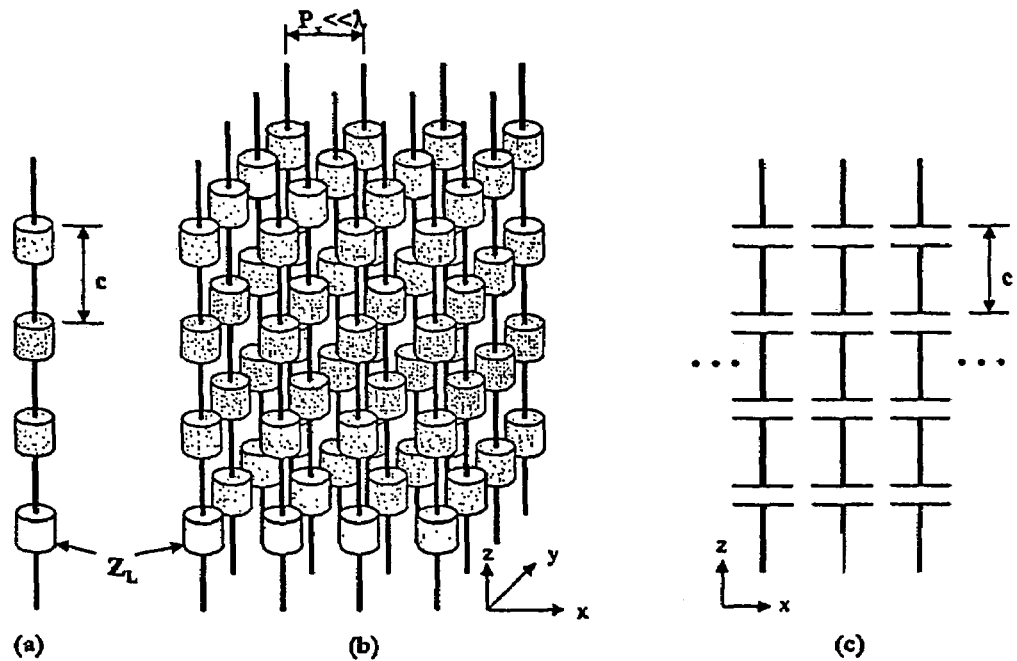

The starting point for the derivation of new inventions is the loaded wire media: (a) a single wire with uniform periodic series loads, (b) a rectangular array of loaded wires, (c) loads are now defined as parallel-plate capacitors.

Prior Art

FIG. 5

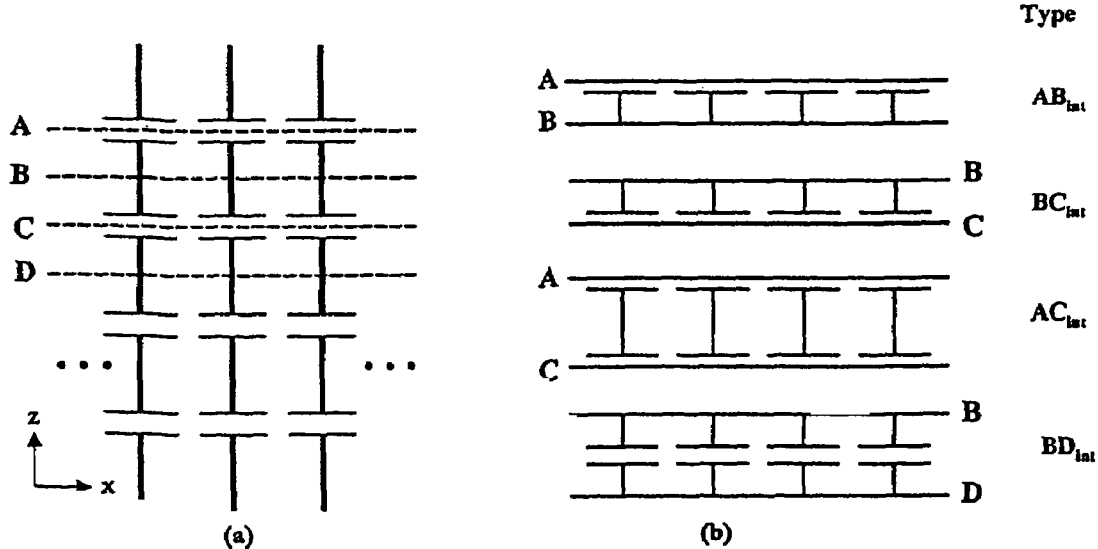

Exploit the planes of physical symmetry to obtain electromagnetically equivalent structures: (a) the infinite wire media, (b) PPW structures of finite height. The supporting dielectric structure is not shown.

FIG. 6

Alternative embodiments of PPW stop band filters: (a) Capacitive-loaded infinite wire media, (b) a PPW filter of finite height using internal capacitors, (c) PPW filters of finite height using external capacitors. The supporting dielectric structure is not shown.

Hybrid embodiments include combined internal and external capacitive loads. Dielectric cores are omitted for clarity.

Elevation view of a square lattice of internal T resonant vias.

Brillouin zone for a 2D periodic structure with a rectangular lattice of unit cell dimensions a x b in Cartesian coordinates.

Dispersion diagram along the ΓX line for the capacitive-loaded wire media corresponding to the array of resonant vias shown in Figure 9. The stop bands are bracketed.

Dispersion diagram along the ΓM line for the capacitive-loaded wire media corresponding to the array of resonant vias shown in Figure 9. The stop bands are bracketed.

(a)
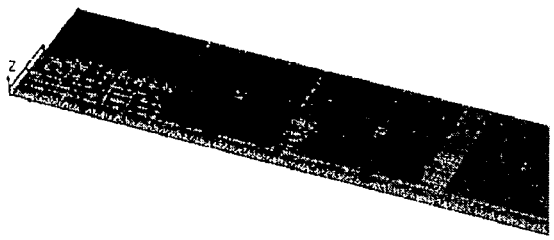
(b)
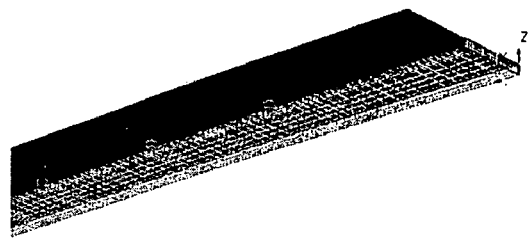
(c)
Geometry for the simulation of the resonant via array shown in Figure 9: (a) plan view showing all 8 cascaded unit cells, (b) top view with upper plate hidden, (c) bottom view with the lower plate hidden.
FIG. 13

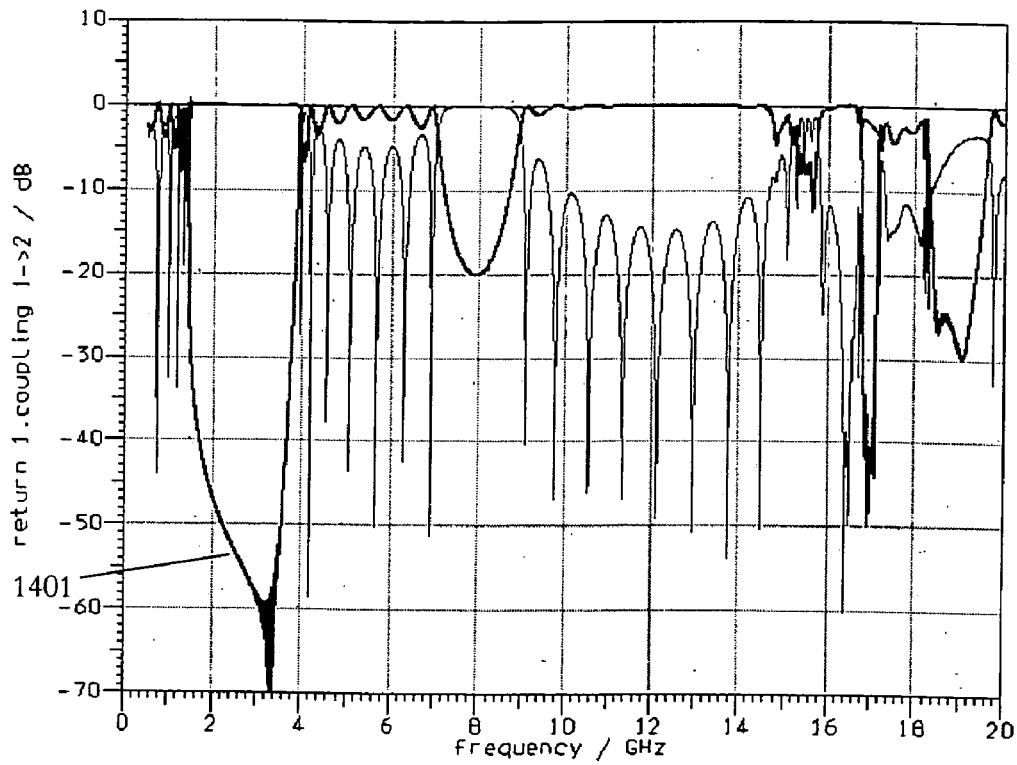

Transmission response for a TEM mode propagating in the x direction through the stop band filter shown in Figure 9. A −10 - dB stop band is shown from 1.4 GHz to 3.9 GHz, a ratio of 2.78:1.

FIG. 14

| Stopband | Microstripes | | Eigenvalue Solution | |
|---|---|---|---|---|
| | Lower Band Edge (GHz) | Upper Band Edge (GHz) | Lower Band Edge (GHz) | Upper Band Edge (GHz) |
| Fundamental | 1.401 | 3.906 | 1.422 | 4.036 |
| Secondary | 7.07 | 8.85 | 7.198 | 8.918 |
| Tertiary | 18.28 | 19.62 | 18.21 | 19.54 |

Comparison of stop band frequencies for the PPW filter shown in Figure 9.

FIG. 15

At lower frequencies around the first stop band, wave propagation along a principal axis, such as the x-axis, can be modeled using a simple transmission line circuit model.

Examples of resonant via arrays with commensurate periods. Each is a PPW stoop band filter.

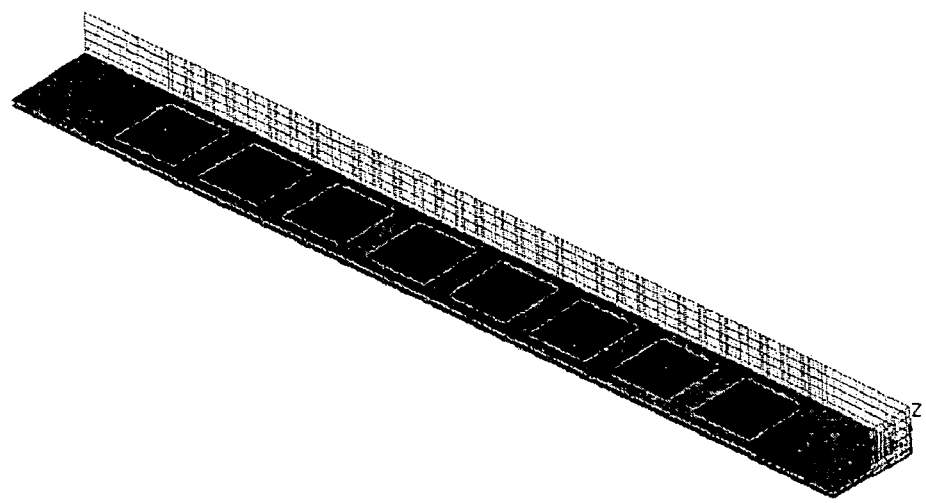
(a)
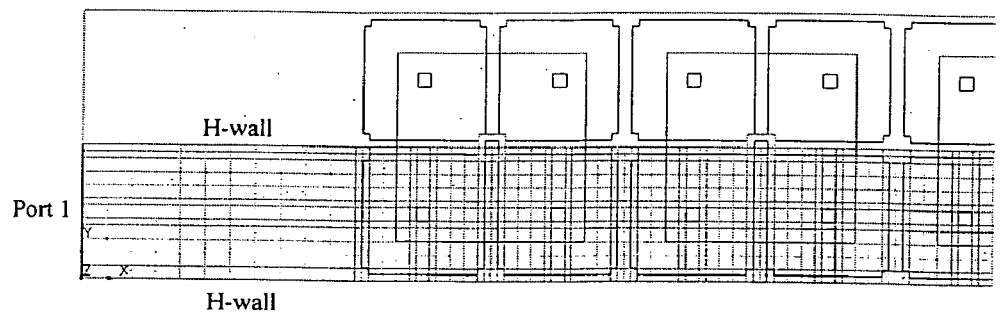
(b)
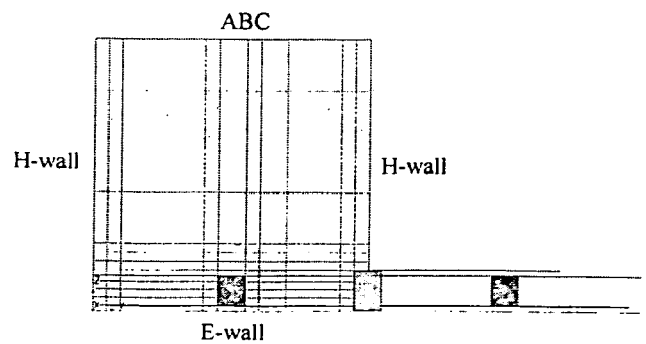
(c)
Geometry for the simulation of a commensurate period resonant via array of type H12: (a) perspective view showing all 8-cascaded unit cells, (b) plan view, (c) elevation view. Hidden are the dielectric cores in (a), (b) and (c).
FIG. 18

Transmission response (1901) for a TEM mode propagating in the x direction through the stop band filter shown in Figure 18. A −10 dB stop band is shown from 1.33 GHz to 10.0 GHz, a 7.5:1 ratio.

Stop band filter embodiment $EF_{ext}$ is well suited for integration into existing PWB designs since it requires neither additional metal layers nor any additional thickness.

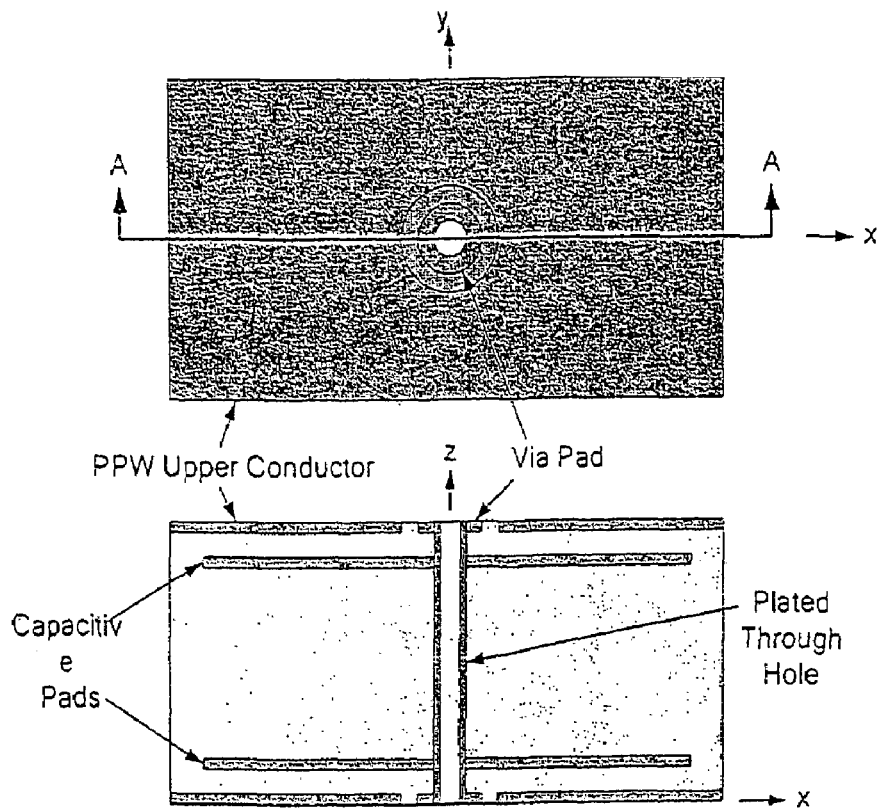

Plated through holes may be used in the fabrication of resonant vias as illustrated here for an internal I resonant via.

FIG. 21

|  | Mechanically-Unbalanced | Mechanically-Balanced |
|---|---|---|
| Internal | Internal "T" | Internal "double T"<br><br>Internal "I" |
| External | External "T" | External "I" |
| Hybrid |  | Hybrid "I" |

Examples of fundamental resonant cluster via types consisting of two or more vias connected in parallel. Dielectric layers required for support are not shown.

FIG. 22

Comparison of effective parallel-plate areas available for one large diameter via compared to an electrically equivalent cluster via comprising a ring of 8 smaller diameter vias.

Pair of resonant vias showing signal via passing through the PPW.

Plan and elevation cross-sections of exemplary cluster via with interior signal via.

Cluster via with interior signal via as in FIG. 25.

Faraday cage formed by cluster of vias as in FIG 24.

SYSTEMS AND METHODS FOR BLOCKING MICROWAVE PROPAGATION IN PARALLEL PLATE STRUCTURES UTILIZING CLUSTER VIAS

RELATED APPLICATION INFORMATION

This application claims priority as a continuation-in-part to U.S. application Ser. No. 10/796,398, entitled, "Systems and Methods for Blocking Microwave Propagation in Parallel Plate Structures", filed on Mar. 8, 2004, of which is incorporated herein in its entirety as if set forth in full.

BACKGROUND

1. Field of the Inventions

The field of the invention relates generally to systems and methods for blocking the propagation of electromagnetic waves in parallel plate structures and more particularly, to electromagnetic noise reduction in layered electronic devices.

2. Background Information

Electronic devices are often configured as layered assemblies of two-dimensional structures. These layered assemblies, which include such familiar devices as printed wiring boards, multi-chip modules, and integrated semiconductor chips, are known generally as "multi-layer preformed panel circuits" or simply "panel circuits". Electromagnetic noise propagation in panel circuits has become increasingly problematic as increases in performance dictate simultaneously higher device operating speeds and decreased operating voltages. Both of these trends have converged to make these devices more susceptible to electronic noise, thereby limiting panel circuit performance because of spurious electrical signal levels generated primarily within the panel circuit itself. One particularly troublesome noise source is high-speed digital switching noise imposed on the nominally constant voltage (DC) power distribution system. DC power distribution is most commonly accomplished in panel circuits by means of two closely spaced and substantially parallel conductors, generally referred to as the "power plane" and the "ground plane". This general structure unfortunately also enables radio frequency (RF) noise propagation throughout the device by acting as a parallel-plate waveguide (PPW). Various means have been employed to attenuate this electronic noise by, for example, inserting strategically placed shunt capacitors and/or selecting the location of sensitive components to correspond to voltage minima in the noise spatial distribution. These methods are relatively effective at frequencies below about 500 MHz. Above this frequency level, there remains a growing need for more effective means of electrical noise isolation.

One possible approach to mitigating the effect of power plane noise in panel devices would be to impose within the power plane, RF blocking filter structures that could operate effectively above 500 MHz. A particularly effective design of high-frequency RF filter is the 'waffle iron' filter, first proposed in 1950 by S. B. Cohn. Waffle iron filters are a type of low-pass corrugated waveguide filter that contains both transverse and longitudinal slots cut into the internal walls of the rectangular guide. These slots create opposing teeth or bosses, resulting in the structure suggesting its name. Waffle iron waveguide filters, as depicted generically in FIG. 1, are characterized by wide, high-attenuation, two-dimensional "stop bands". Stop bands are spectral regions where electromagnetic wave propagation is impeded due to the constraints imposed by a periodic array of interactive elements. The topology, capacitance, and inductance of the waffle iron filter's resonant elements define its stop band characteristics. Waffle iron filters were originally designed for high power microwave applications, and its embodiments for this application are not well suited to small-scale panel circuits. However, the technologies that have arisen in support of circuit board, integrated circuit, and other types of panel circuit fabrication are adaptable to making various types of miniaturized resonant elements that could be configured to produce compact filters that have a similar effect, or characteristics of a waffle iron type of filter.

For example, in printed wiring boards (PWB's), "resonant vias" can be fabricated. A resonant via is used here to denote a shunt electrical circuit containing one or more plated through holes (PTH) in series with one or more capacitors. PTH's are routinely fabricated in PWB'S, as well as in other panel circuit devices such as multi-chip modules and integrated ciruits (IC's). The term "resonant via" was introduced by Sedki Riad in his U.S. Pat. No. 5,886,597 (Riad). However, Riad more narrowly claimed a resonant via as one PTH in series with one capacitor and his patent emphasizes only the RF decoupling application for resonant vias, where they are used as a low impedance interlayer connection between metal layers in multilayer PWB's. Although Riad discloses the use of multiple resonant vias, he does not suggest the idea of employing a periodic array for the purpose of creating a well defined stop band filter.

SUMMARY OF THE INVENTION

A method for configuring systems of RF filters adaptable to panel type circuits such as printed wiring boards, integrated circuits, multi-chip modules and the like. In one aspect, a generalized method for generating a comprehensive set of resonant via topologies and the incorporation of these topologies into systems of periodic arrays are adaptable to the problem of reducing RF noise within parallel plate waveguide (PPW) structures. More particularly, the method disclosed address the problem of millimeter and microwave propagation within the parallel PPW structures that are inherent in the generally layered character of panel circuits.

These and other features, aspects, and embodiments of the invention are described below in the section entitled "Detailed Description of the Preferred Embodiments."

BRIEF DESCRIPTION OF THE DRAWINGS

Features, aspects, and embodiments of the inventions are described in conjunction with the attached drawings, in which:

FIG. 1 illustrates a prior art waffle-iron waveguide filter.

FIG. 2 illustrates an elevation view showing an array of resonant vias.

FIG. 3 illustrates an equivalent circuit for a resonant via shown in FIG. 2.

FIG. 4 illustrates five basic types of resonant vias.

FIG. 5 illustrates a wire periodically loaded with uniform series impedances, an array of such loaded wires to create a loaded wire medium, and a special case of this medium using parallel-plate capacitors as circuit loads.

FIG. 6 illustrates planes of symmetry in a capacitive loaded wire medium, and several exemplary equivalent parallel-plate waveguide (PPW) stop band filters.

FIG. 13 is the simulated geometry for the resonant via array shown in FIG. 9.

FIG. 14 presents the TEM mode transmission and reflection response for the array of resonant vias shown in FIG. 13.

FIG. 15 presents a comparison of the stopband performance predicted by two methods: numerical (Microstripes) simulation on a finite sized array versus an eigenmode calculation of an infinite array.

FIG. 18 illustrates a commensurate periodic array comprising a cascade of eight unit cells of resonant vias of type H12 shown in FIG. 17.

FIG. 21 illustrates a resonant via comprising a plated through-hole as it might be realized in a printed wiring assembly (PWA).

FIG. 22 presents examples of fundamental resonant cluster via types consisting of two or more vias connected in parallel.

DETAILED DESCRIPTION OF THE PREFERRED EMBODIMENTS

Figure 7:
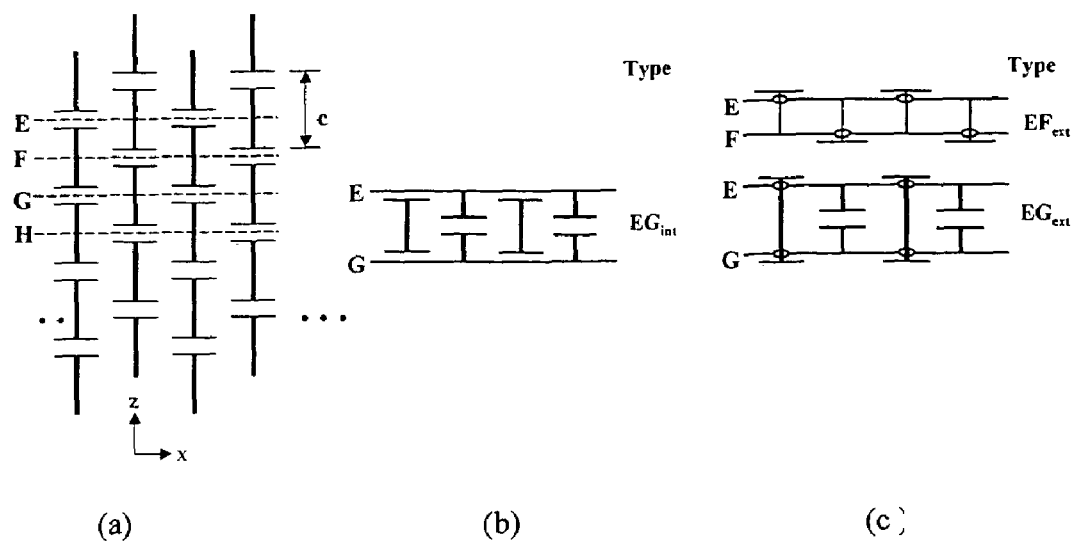
FIG. 7 illustrates an alternative implementation of a loaded wire medium, and several embodiments of PPW stop band filters derived using planes of symmetry.

FIG. 2 depicts a general example of the invention of Riad, implementing a grounding scheme by a plurality of resonant vias interposed between a PPW structure as disclosed in FIG. 2 of Riad. FIG. 3 shows Riad's equivalent circuit model of a single resonant via of FIG. 2, which consists of an inductor (LV) in series with a capacitor (CV) that models, respectively, the inductive via post 14a and capacitive plate 14b of FIG. 2. This idealized circuit comprises a resonant shunt circuit between the upper plate 4 and lower ground plate 10. Riad showed that by appropriately configuring the dimensions of the vias, particular values of inductance LV and capacitance CV are produced so that the impedance of the shunt circuit can be made essentially zero in the desired region around the resonant frequency and finite elsewhere. Riad's resonant vias have many applications for circuit boards, such as for shunting spurious signals of a particular frequency.

Riad, does not suggest, however, the use of the structures disclosed therein in periodic arrays, wherein the periodicity of the array combines with the resonant character of the vias to effect a stop band RF filter for PPW modes. What is not taught, and which is disclosed here, is the utility of combining the teachings of Riad for resonant vias with that pertaining to waffle iron filters. By combining these teachings, certain RF filter topologies that are particularly adaptable to the problem of blocking RF noise in PWB's in particular, and panel circuits in general, can be developed in accordance with the systems and methods described below. There are currently known in the art three topologies that are adaptable as resonant vias, the simple "T" and external "T" topologies disclosed by Riad, and the buried single layer capacitor internal double "T" disclosed in U.S. Pat. No. 6,542,352 to Devoe et. al. (Devoe). These three topologies are presented together with three newly conceived resonant via topologies in FIG. 4. All the basic topologies of FIG. 4 can be conveniently categorized as either "T" or "I", and further categorized according to whether they are "internal", "external", or "hybrid" combinations thereof. The term hybrid is used to define configurations that include both internal and external capacitive pads or patches. The topologies can be additionally categorized as to whether they are mechanically "balanced" or "unbalanced", as will be elucidated below.

In addition to the specific new topologies advanced in FIG. 4, a method is presented below for deriving a comprehensive collection of filter topologies using the topologies included in FIG. 4. Specifically, a comprehensive set of resonant element topologies can be derived by starting with a generalized array of periodically loaded conductors aligned perpendicular to the PPW. This electromagnetic model has been applied, for example, by Sergei Tretyakov for analyzing man-made metamaterials. Tretyakov's loaded wire media model provides a very general and powerful tool for generating a wide assortment of resonant element topologies when combined with the systems and methods described herein.

FIG. 5 depicts an idealized loaded wire array model as suggested Tretyakov. It consists of an evenly distributed array of parallel wires, each of which consists of a periodic sequence of inductors and capacitors. In this particular example, the inductors (wire segments) and the capacitors (parallel plate segments) are in registry along the Z direction and are equally space in the X and Y dimensions, thus forming a three-dimensional lattice structure. The utility of this model in the present context is not readily apparent until it is realized, as taught herein, that a plane of symmetry in X & Y can be replaced by a conducting surface. By truncating the loaded wire media with a conducting plane along planes of symmetry, the electrical properties of the periodic array are unchanged in the X & Y dimensions. The reason why the periodic loaded wire media may be truncated with conductors in this manner is that the planes of symmetry for the infinite (in the Z direction) wire media are also electric walls, defined to be locations where the tangential electric field goes to zero. As will be presently demonstrated, this procedure provides a powerful method for deriving a great many different, but electrically equivalent, topologies.

FIG. 6a depicts a segment of the Tretyakov loaded wire media model that includes four periods of three wires of the loaded wire array of FIG. 5. Locations A and C, and B and D are at the planes of symmetry of the capacitors and inductors, respectively. FIG. 6b shows the corresponding structures obtained by truncating the periodic loaded wires with conducting metal surfaces between various planes of symmetry. It is important to note that all of the structures denoted in FIG. 6b are electrically equivalent as stop band filters and have exactly the same electromagnetic wave propagation characteristics in the X & Y dimensions as the original infinite three-dimensional structure.

This same essential methodology can be extended then to include periodic loaded wires where the loads are staggered along the Z direction as is presented in FIG. 7a. Shown in FIG. 7b is an exemplary embodiment obtained by truncating along the corresponding planes of symmetry E and G in FIG. 7a. This method for generating equivalent topologies can be extended even further by recognizing that the capacitor plates can be located external to the conducting planes. Examples of external variant topologies are shown in FIG. 7c. As can be appreciated, due to the longer via length, the PTH wire diameter must be increased in the external variant to maintain the same total inductance as its internal equivalent. Topologies that are even more complex can be generated by combining two or more of the topologies obtained by the symmetry plane method, including various hybrid combinations of internally and externally located capacitor plates.

Figure 8:
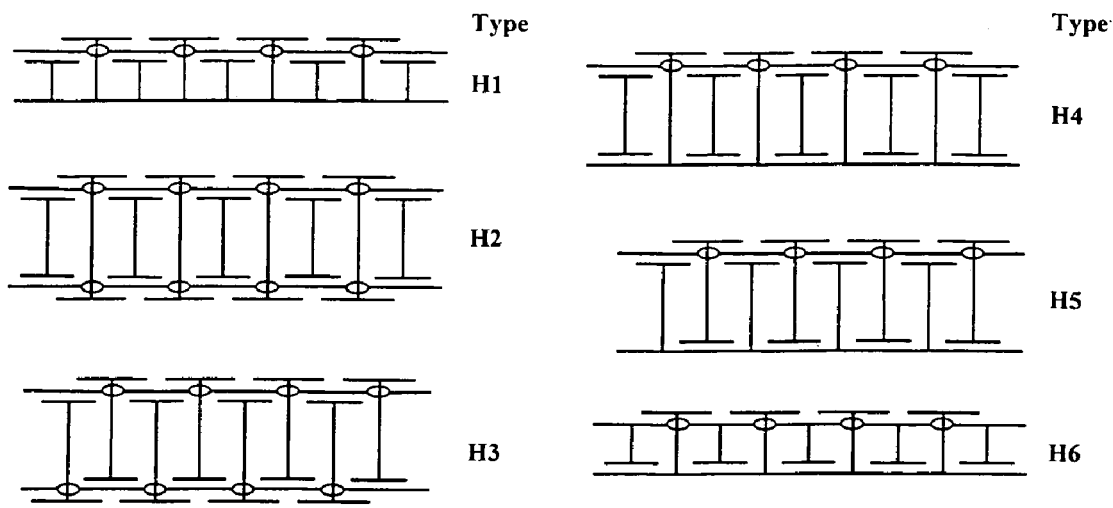
FIG. 8 illustrates hybrid embodiments of PPW stop band filters that include both internal and external capacitive loads.

FIG. 8, for example, presents six possible hybrid topologies. The impedances of all the individual resonant elements, external and internal, can be configured to be equal, or periodic portions of each can be configured to have different values, thus providing the engineer with useful additional design freedom with regard to the RF filter characteristics.

As can be appreciated from the above description, a virtually unlimited number of topologies can be generated by starting with any one of the many conceivable three-dimensional periodic loaded wire lattice structures and then applying the symmetry plane methodology described above. For example, topologies that are substantially symmetric about a plane midway between the parallel plates of the PPW are particularly useful for the construction of printed wiring boards because they are less prone to warping under thermal stress. Topologies that are substantially free from warping under thermal stress are considered "mechanically balanced". It is not necessary for the topology to be exactly symmetric in order to effect a mechanically balanced structure. Which structures are, and are not, sufficiently symmetric to be mechanically balanced will be influenced by a particular implementation or technology.

A mechanically balanced panel circuit can be defined as containing (1) an even number of metal layers, and (2) a plane of symmetry with respect to the dielectric cores; i.e., the core thicknesses and material properties including coefficient of thermal expansion are mirrored about the plane of symmetry. Any asymmetric topology can be converted to an equivalent symmetric structure by simply doubling its periodic spacing and then superimposing upon it the same topology inverted, i.e., rotated 180 degrees, and shifted by a half a period. For example, in FIG. 6b, $AB_{int}$ and $BC_{int}$ are inversions of the same imbalanced topology, and combining them as described results in a symmetric and mechanically balanced structure.

It is also recognized that the dimensions of the various topologies can be adjusted in order to effect particular values of inductance and capacitance, e.g., by varying the length and/or diameter of the wire sections to adjust inductance and the area and/or separation of the capacitor plates (pads) to adjust capacitance. It will often be advantageous to maximize the capacitance of the resonant via. Because capacitance increases in proportion to pad area, use of the area available for the pads becomes important. FIG. 5 illustrates a rectangular array of loaded wires, for which rectangular pads efficiently use the available area. However, other periodic array lattices are possible for stop band filters, such as triangular or hexagonal arrays of wires, for which efficient pad shapes will have a hexagonal or triangular geometry, respectively. The dielectric properties of the material in which the resonant vias are embedded can also be advantageously selected to better meet certain goals, e.g., a material with high dielectric constant (permittivity) can be chosen to increase the capacitance for a given plate spacing. These impedance parameters, together with the spacing and periodicity of the resonant elements, can be used in concert to design filters with the desired stop band characteristics, as is known to those in the art familiar with the theory of wave propagation in periodic structures.

The theory of wave propagation in periodic resonant structures, as first propounded by Cohn and further developed by others including Tretyakov, provides the design engineer with a solid basis for designing RF filters with predictable behavior. Although one can employ various numerical and analytical approaches to solving the filter problem, the treatment provided by Tretyakov for modeling loaded wire media will be applied by way of example.

Figure 9:
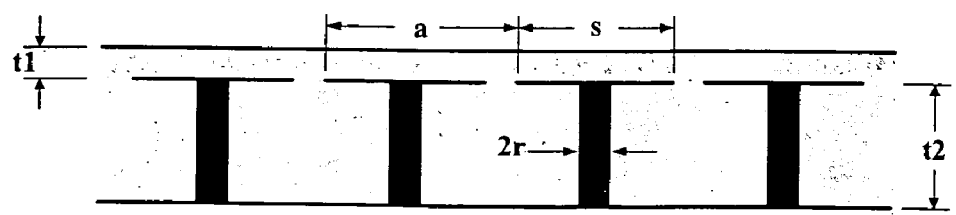
FIG. 9 illustrates an elevation view of an array of internal T resonant vias.
Figure 10:
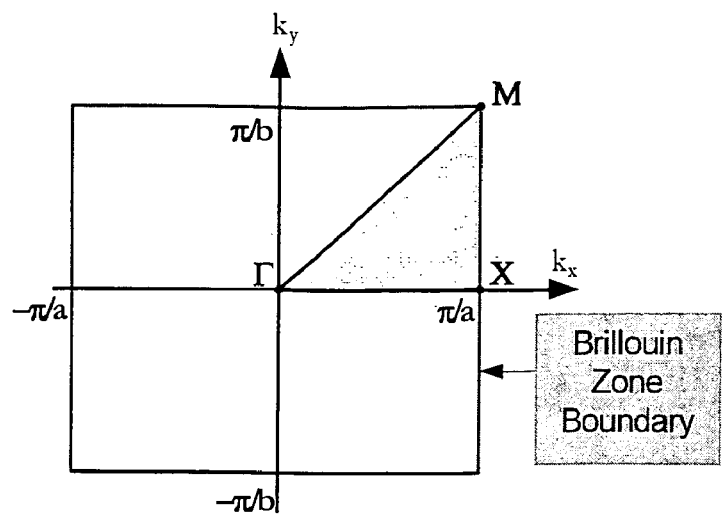
FIG. 10 illustrates the Brillouin Zone for a rectangular periodic array whose periods in the x and y directions are "a" and "b".

Consider an example comprised of a square lattice of internal T resonant vias containing square pads and round vias of radius r. An elevation view of the array is shown in FIG. 9. Let the period be 400 mils in both x and y directions such that a=b=400 mils. Let t1=4 mils and t2=22 mils such that the entire thickness of the PPW is 26 mils assuming the conductors are modeled with zero thickness. Assume the blind vias have a diameter of 20 mils (radius r=10 mils) and a length t2 of 22 mils. The size of square pads is s=340 mils, hence a 60-mil gap exists between all pads. A homogeneous isotropic dielectric of relative permittivity $\epsilon_r$=4.2 fills the entire height of the PPW. The first Brillouin zone for a periodic structure with a rectangular lattice is shown in FIG. 10. The shaded boundary shows the domain in reciprocal space, or wave number space, for allowed values of wave numbers kx and ky. The ΓXM triangle is called the irreducible Brillouin zone because knowledge of the dispersion solution in this triangular domain will allow the entire dispersion surface in the rectangular domain to be identified through symmetry arguments.

The important thing to understand from the Brillouin Zone diagram is that the propagation constants for wave propagation in the x direction only, a principal axis where only kx is nonzero, can be found by examining the dispersion diagram along the ΓX line. Propagation constants for waves traveling at 45° with respect to the x and y axis (kx=ky) can be found by solving for the dispersion diagram along the ΓM line. Knowledge of the dispersion diagram along both of these domains will reveal a complete stop band if it exists. Tretyakov's eigenvalue equation for loaded wire media, where the eigenwave propagation constants for the x, y, and z directions are defined as $q_x$, $q_y$, and $q_z$, can be rearranged into the more familiar form associated with a shunt loaded transmission line:

$$\cos(q_x a) = \cos(k_x^{(0)} a) + j \frac{\eta_o / \sqrt{\varepsilon_r}}{2\left(Z_s + \frac{k_x^{(0)}}{k} \frac{b}{c} Z_{load}\right)} \sin(k_x^{(0)} a) \quad (1)$$

where $\eta_o$ is the wave impedance of free space, $Z_s$ is the shunt impedance for a planar grid of wires so, and $Z_{load}=2/(j\omega C)$ is the load impedance presented by the capacitive loads on the wires. The capacitance $C=s^2 \epsilon_r \epsilon_o / t_1$ is the parallel-plate capacitance between the pads and the upper parallel plate as shown in FIG. 9. The parameters a, b, and c are the lattice constants, or the periods, in the x, y, and z directions respectively. The period c in the wire media can be determined using $c=2(t_1+t_2)$. The propagation constant $k_x^{(0)}$ is the x component of the n=0 Floquet mode wave vector defined more generally by $$k_x^{(n)} = -j \sqrt{\left(q_y + \frac{2n\pi}{b}\right)^2 + q_z^2 - k^2} \quad (2)$$

where $k = \omega \sqrt{\mu_o \epsilon_o \epsilon_r}$ is the wave number for the host dielectric medium.

Tretyakov has also derived a formula for the shunt impedance for a wire grid:

$$Z_s = j \frac{\eta}{2\sqrt{\varepsilon_r}} \left[\frac{bk_x^{(0)}}{\pi} \ln\left(\frac{b}{2\pi r}\right) + k_x^{(n)} \left\{\sum_{n \neq 0} \frac{1}{k_x^{(n)}} \frac{\sin(k_x^{(n)} a)}{\cos(k_x^{(n)} a) - \cos(q_x a)} - \frac{b}{2\pi |n|}\right\}\right] \quad (3)$$

where r is the wire radius (via radius). The series in equation (3) has negative and positive integer indices but omits the n=0 term. It converges very rapidly. The eigenvalue equation (1) can be solved numerically for the eigenfrequencies as a function of the wave vector ($q_x$, $q_y$, $q_z$). Since propagation in a PPW is limited to waves traveling in the lateral (XY) directions, then $q_z=0$. The solution is actually a set of surfaces in the domain of the Brillouin zone. The eigenvalue equation (1) is real valued for reactive loads, so the solutions can be found using straightforward numerical root finding techniques.

Figure 11:
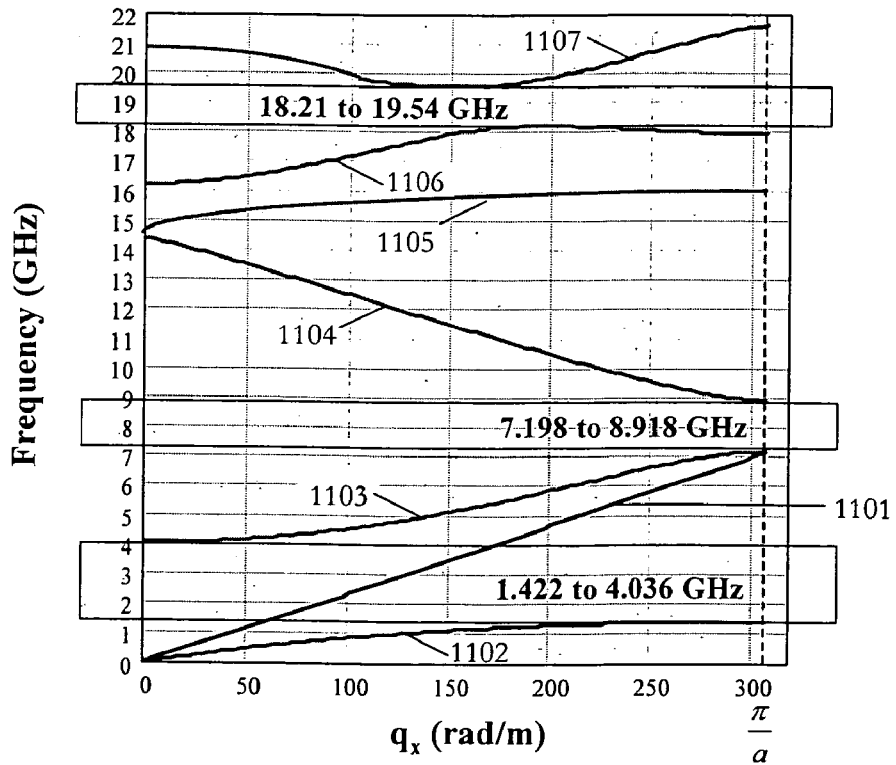
FIG. 11 presents the dispersion diagram along the ΓX line for the square lattice of resonant vias shown in FIG. 9.

Next, the eigenfrequencies are calculated along the domain of lines ΓX and ΓM. FIG. 11 shows the eigenfrequency solution, known as a dispersion diagram, for the ΓX line. This is for TEM mode wave propagation along a principal axis, either the X or Y-axis. The line 1101, is the light line, which defines the wavenumbers for a plane wave traveling through the host dielectric medium. The slope of the line 1101 is the phase velocity for a TEM mode in the PPW for the case where no resonant vias are present. The lines 1102–1107 are the eigenfrequency solution to the eigenvalue equation (1). Note that there exist three well-defined stop bands below 20 GHz.

Figure 12:
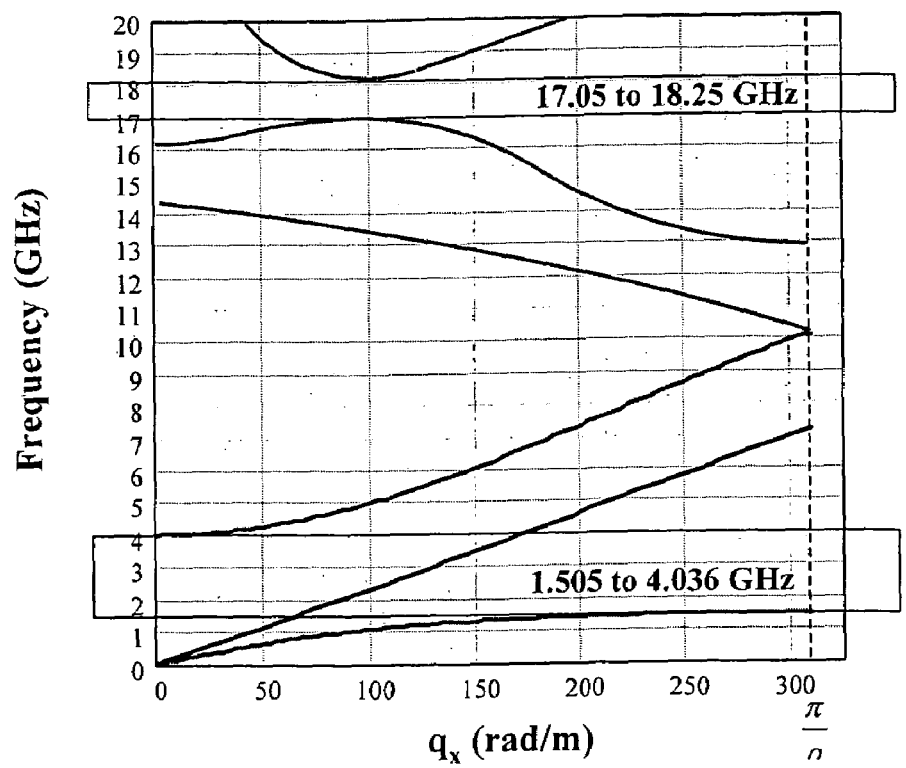
FIG. 12 presents the dispersion diagram along the ΓM line for the square lattice of resonant vias shown in FIG. 9.

FIG. 12 shows the dispersion diagram for the ΓM line, which is for wave propagation in the inter-cardinal direction 45° from either principal axis (x and y axis). In this diagram, $q_x=q_y$ and $0 \leq q_x \leq \pi/a$. Below 20 GHz there exists two stop bands, but only the fundamental stop band coincides in both dispersion diagrams. Common to wave propagation in both directions is a stop band extending from 1.505 GHz to 4.036 GHz. So this frequency range can be viewed as the electromagnetic band gap (EBG) for the capacitive-loaded wire media. In the equivalent PPW filter of FIG. 9, TEM waves traveling in any lateral (XY) direction will be cut off over this frequency range; i.e., they are evanescent waves.

To validate some of the numerical solutions from the eigenvalue equation, a full-wave electromagnetic simulation was performed using Microstripes™, a computational software tool available from Flomerics, Inc in Southborough, Mass. The simulated geometry is shown in FIG. 13. This is a cascade of eight unit cells along the x-axis. In this simulation, the dielectric core has a relative permittivity of 4.2 to simulate the FR4 material commonly used for fabricating PWB's. For simplicity, no dielectric loss is included, all metals are modeled as lossless, and all conductors have zero thickness. This PPW filter was excited as a two port with TEM mode ports defined approximately one unit cell from each end of the cascaded unit cells. The boundary conditions at the sides of the grid ($y_{min}$ and $y_{max}$) are magnetic walls due to the symmetry of the unit cells. Note that for this direction of propagation (+X-axis) there is a magnetic wall through the center of each unit cell and along the sides.

The simulated transmission response for TEM waves 1401 is shown in FIG. 14. At least three stop bands are clearly identified. Using the −10 dB level as a gauge for defining the band edges for the stop bands, a summary of the stop band frequencies is shown by the table in FIG. 15. Excellent agreement is seen between the eigenvalue solution and the full-wave simulation for the comparison case of propagation in the x direction. Hence, the equivalence between a loaded wire media and an array of resonant vias is demonstrated numerically.

Figure 16:
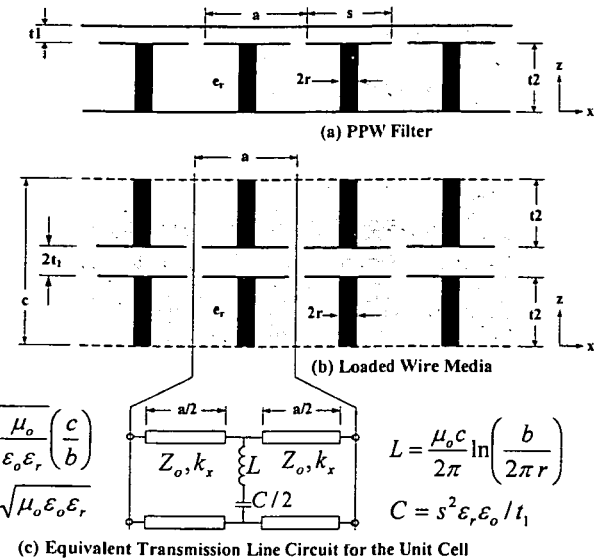
FIG. 16 illustrates an equivalent loaded wire medium for a given array of internal T resonant vias, as well as the equivalent circuit for the principal axis wave propagation in the medium.

The simplest possible model is often helpful for gaining insight. Circuit models are generally the simplest and most powerful models for engineers to use given the availability of modern software tools. It is, therefore, useful to develop an equivalent circuit model for the PPW stop band filter to which these software analysis tools can be applied. Consider FIG. 16, which illustrates an array of internal T resonant vias in part (a), its equivalent loaded wire media in part (b), and an equivalent circuit model for the wire media in part (c). The inductance of a wire of length c in the wire media is given by $$\frac{Z_s}{j\omega} \frac{c}{b}$$

where $Z_s$ is given by equation (3) above. This inductance is frequency dependent, and it actually exhibits a resonance just below the third stop band. However, at low frequencies, such as near the fundamental stop band, this inductance can be approximated with the very simple frequency independent equation shown in FIG. 16(c). The capacitance C is simply the parallel-plate capacitance between the pad and the upper plate. The characteristic impedance $Z_o$ is defined by the height c and width b of one unit cell in the infinite wire media. One unit cell of the infinite wire media has an equivalent circuit for TEM mode propagation consisting of a transmission line with a shunt LC load. The fundamental stop band can be readily determined from this model by using standard techniques such as a calculation of the image propagation constant or image impedance. Topology type $AB_{int}$ has been used in this derivation. However, simple transmission line models are appropriate for all of the PPW stop band filter types derived from FIG. 5(b) or 7(a).

Figure 17:
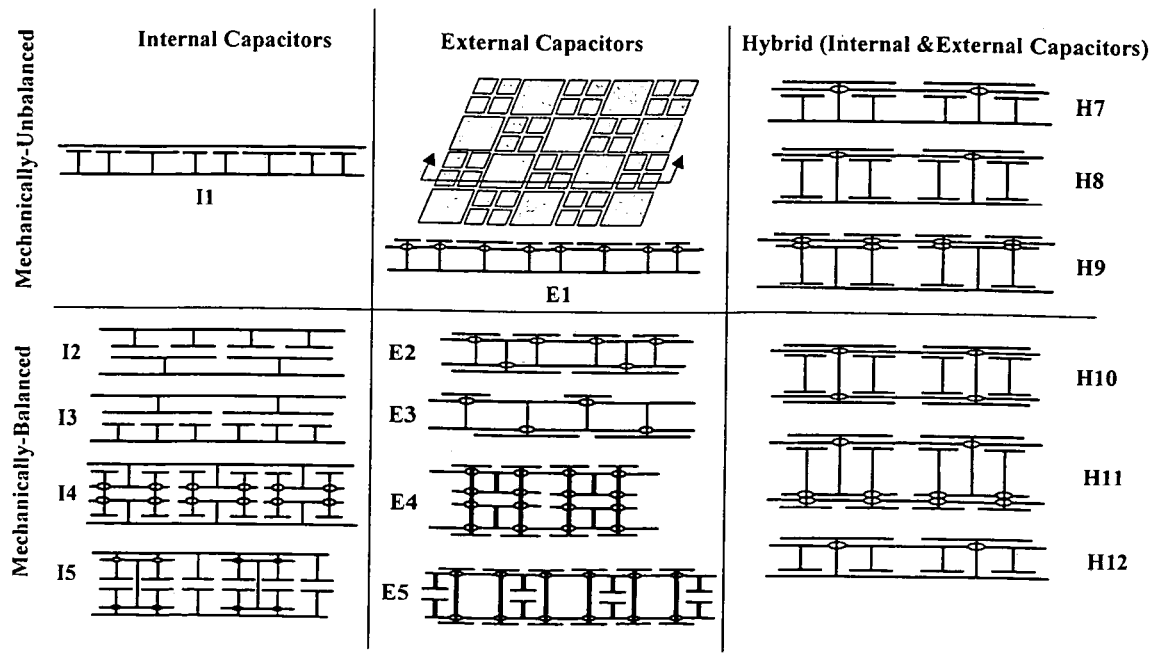
FIG. 17 illustrates various embodiments of resonant via arrays with commensurate periods.

It can be advantageous in terms of the resulting stop band characteristics to combine in one overall structure, arrays having more than a single period. This can be readily accomplished by superimposing on the base periodic structure, one or more "commensurate" periodic structures, which are integer multiples of the base period. In other words, a commensurate array has multiple repeated features within a larger unit cell. Some examples of the many possible embodiments of commensurate period resonant via arrays are illustrated in FIG. 17. All of the examples in FIG. 17 are linear combinations of resonant via types that can be derived using the loaded wire media model as described above. Most of these examples employ scaling in the lateral dimensions as well as dual period translations to achieve the final structure. A simple example is array E1 where larger external pads are arrayed in a checkerboard fashion and sets of four smaller external pads fill in the areas between the larger pads.

The merit of arrays with commensurate periods is that these super-lattice filters can be shown to offer much broader stop band performance than single period filters. Consider the internal array H12 in FIG. 17. A Microstripes™ simulation was run to calculate RF transmission through a cascade of eight H12 unit cells. The simulated structure, shown in FIG. 18, has a period of 400 mils defined by the larger pads. Large pads are 280 mils square and small pads are 180 mils square. The small pads have a 200 mil period, or one-half that of the larger pads. All vias are 20 mils square and either 22 or 30 mils in total length corresponding to internal or external vias, respectively. The upper parallel plate of the PPW has apertures 40 mils square to allow the vias connecting the exterior pads to penetrate without touching. All pads are spaced 4 mils from the PPW plates, giving the structure a total thickness of 30 mils. The dielectric core has a relative permittivity (dielectric constant) of 4.2 to simulate FR4. This dielectric is assumed to have a loss tangent of 0.02 at 4 GHz. All metals are modeled as lossless, and all conductors have zero thickness. This PPW filter was excited as a two port with TEM mode ports defined approximately one unit cell from each end of the eight-cascaded cells. The boundary conditions at the sides of the grid ($Y_{min}$ and $Y_{max}$) are magnetic walls due to the symmetry of the unit cells. Note that for this direction of propagation (+X axis) there is a magnetic wall through the center of each unit cell and along the sides.

Figure 19:
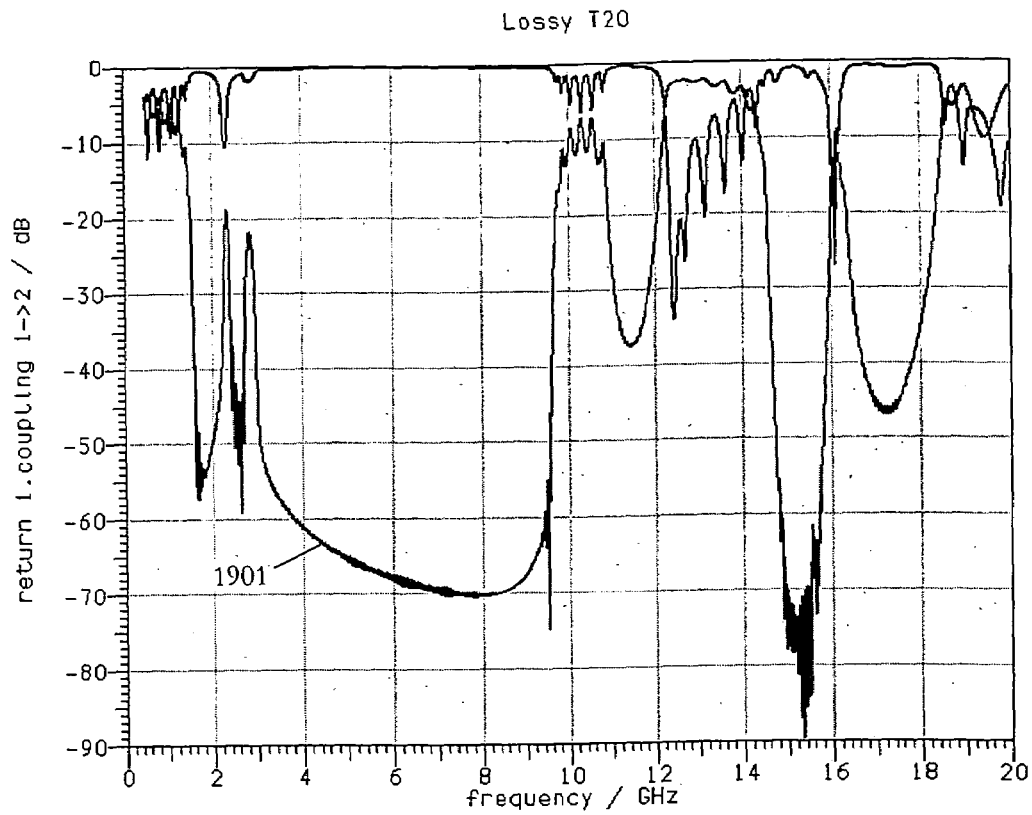
FIG. 19 presents the TEM mode transmission and reflection response for the cascaded commensurate array of resonant vias shown in FIG. 18.

The transmission response 1901 is shown in FIG. 19. Observe that a fairly wide fundamental stop band exists from about 1.33 GHz to 10.0 GHz, as defined by the −10 dB level on the S21 plot. Note that this commensurate array PPW filter has the same period as the simpler resonant via array of FIG. 13. The merit of this more complex array of resonant vias can be seen by comparing the simulation results with that of FIG. 14. It can be seen that incorporating an additional commensurate array has moved the upper edge of the fundamental stop band up from 3.9 GHz to 9.67 GHz, so the fundamental stop band now covers a frequency ratio of about 7.5:1 compared with 2.8:1 for the simple periodic array. This particular simulation is only an example to demonstrate the general stop band broadening effect that is achievable with commensurate arrays and has not been optimized for any particular filter characteristic.

Figure 20:
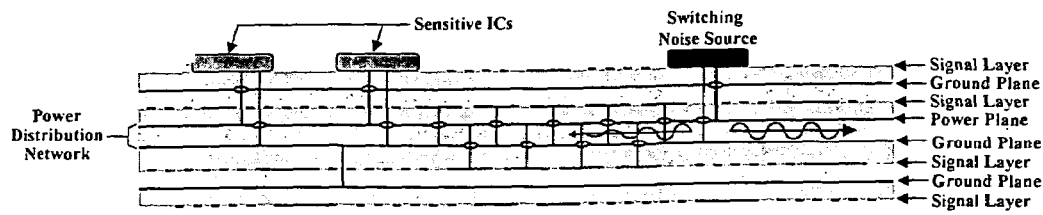
FIG. 20 illustrates an embodiment of a PPW stop band filter integrated into the power distribution network of a multilayered preformed panel circuit.

FIG. 20 shows the conceptual layout of a typical eight-layer PWB that has been adapted to include a particular stop band filter embodiment. As can be seen, the $EF_{ext}$ topology utilized in this example is easily incorporated into existing PWB designs since it requires neither additional metal layers nor any additional thickness. Various other external patch topologies such as the $AC_{ext}$ topology could also be adapted without adding metal layers and the attendant thickness to the PWB. Furthermore, the EFext topology can be implemented as a commensurate structure, such as E2 in FIG. 17, to obtain a broader stop band.

It will be understood by those skilled in the art of panel circuit design that the particular type of via embodiment employed in fabricating the resonant vias will vary with the type of panel circuit and other circumstances. For example, in PWA's the most common type of via is a plated through-hole (PTH). For this particular embodiment, in may be expedient for manufacturability reasons to construct internal I or internal T structures using vias with lengths that extend beyond the internal capacitive pads, at least to the PPW metal layers. These vias may be conveniently terminated in separate via pads, forming what is known in the art as a "blind via" as is shown in FIG. 21. Substitution of blind vias in place of exact length PTH's has virtually no impact on the fundamental stop band performance of the RF filter since negligible capacitance is added by extending the via, and negligible inductance is added since the current that travels through the via extension is also negligible.

It is generally advantageous to maximize the resonant via capacitance inductance product in order to lower the stop band edge. However, stop band bandwidth is related to the ratio of capacitance to inductance. Thus, there are certain applications where it is advantageous to decrease via inductance and thereby raise the lower band edge frequency in order to achieve a broader effective stop band. This may be particularly true in ultra-high speed circuits such as are encountered in fiber optic communication applications where the switching (noise) frequency is much higher than found, for example, in typical computer applications. However, there may be practical problems associated with fabricating vias of substantially larger diameter. These problems can be obviated by substituting a cluster of smaller diameter vias, which are otherwise electrically connected in the same essential manner as the single via they replace; e.g., as internal or external T's or I's, or combinations thereof. By appropriate choice of the number and diameter of the vias in the cluster, their combined inductance can be reduced to be equal that of a single larger diameter via. For example, the inductance of a single isolated via 200 mils in diameter and 30 mils long is about 0.075 nH while a via of the same length and 20 mils in diameter is about 0.425 nH. Thus, six of the smaller diameter vias connected in parallel as a cluster, whereby their combined inductance is reduced by a factor of ⅙, have a combined inductance of 0.071 nH, essentially equivalent to the single larger diameter via. This general procedure, including the effects of environment and mutual interactions, can be applied for selecting a variety of via cluster geometries with equivalent inductance. Advantages of small diameter vias include easier manufacturability and reliability as compared to large diameters where slumping of the prepreg cores can become problematic. Via clusters may be disposed in any convenient geometry within the boundaries of the pad or pads to which they connect. It can also be appreciated that the variety of topologies available for cluster vias is at least as diverse as that disclosed for singular vias, which are based on combinations of fundamental via topologies. More particularly, the five fundamental internal and external "T" and "I" topologies presented in FIG. 4. have five corresponding fundamental cluster topologies as depicted in FIG. 22.

Figure 23:
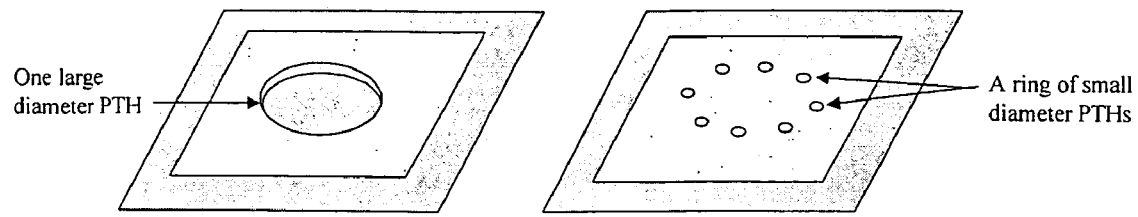
FIG. 23 presents a comparison of effective parallel-plate areas available for one large diameter via compared to an electrically equivalent cluster via comprising a ring of 8 smaller diameter vias.

While it is sometimes desirable in terms of bandwidth to construct resonant vias with large capacitance to inductance ratios, accomplishing this by increasing the via diameter is inherently problematic because increasing the cross-sectional area of the connecting via necessarily reduces the effective area, and hence capacitance, of the capacitive pad. Consequently, significant shunt capacitance is lost as via radius increases. In fact, the decrease in shunt capacitance goes up as the square of the via radius. However, by using a cluster via, for example in the form of a ring of vias, in place of a single large diameter via, the interior of the ring becomes available as parallel-plate area that helps increase shunt capacitance. Typical sizes of vias used in a cluster may be only 10 mils to 20 mils in diameter. Shown in FIG. 23 is an example of an internal T resonant via with the upper plate of the PPW removed. On the left is depicted a large diameter via of diameter 150 mils. The area lost in the drilling operation is 17671 sq. mils for this one via. On the right is depicted an electrically equivalent circular cluster comprising eight 20 mil diameter vias located on a circle of 75 mils radius. The area lost in drilling these 8 smaller holes is only 2513 sq. mils. Assuming a 300 mil square pad, 20% of the area (capacitance) is lost using a large via, whereas only 2.8% of the area (capacitance) is lost using all eight smaller vias.

Figure 24:
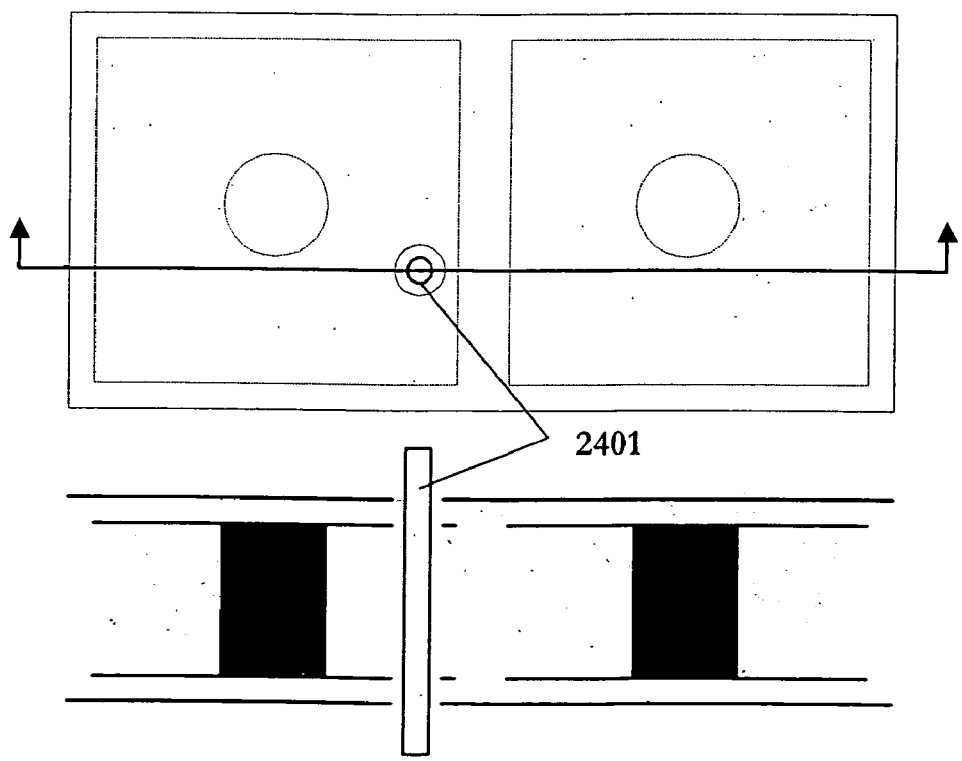
FIG. 24 illustrates a pair of resonant vias showing a signal via passing through the PPW.
Figure 25:
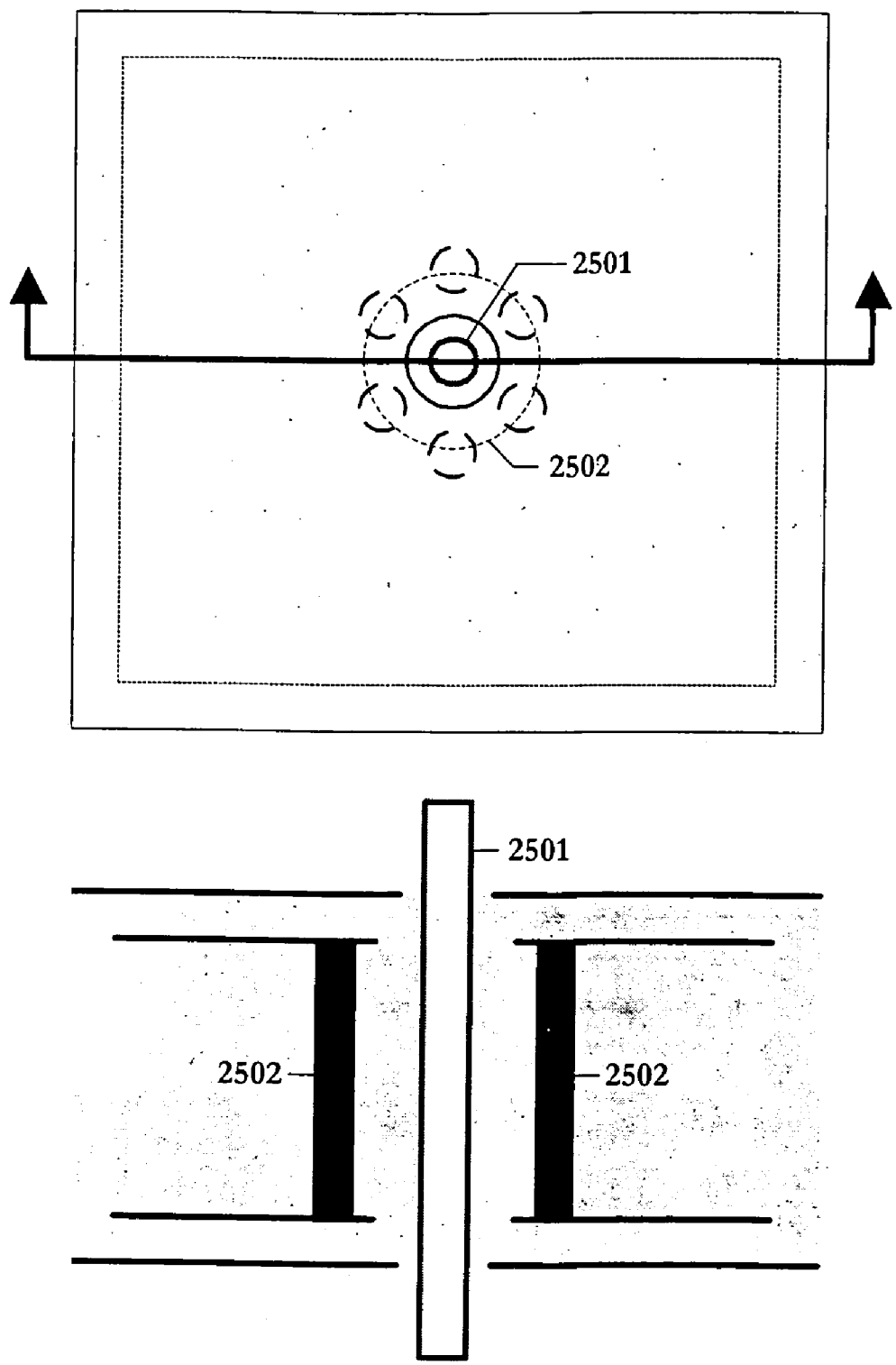
FIG. 25 illustrates a cluster via configured for passing a shielded signal via.
Figure 26:
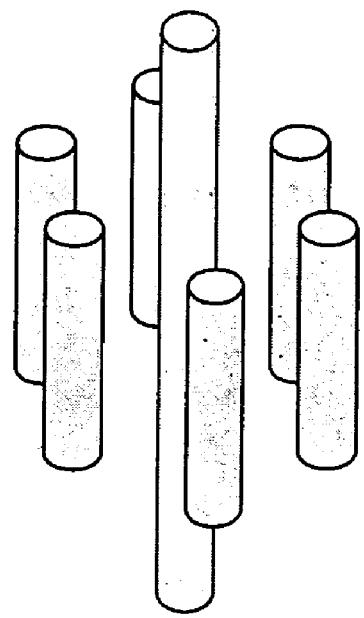
FIG. 26 presents a perspective view of the cluster via of FIG. 25 with the conducting planes removed for clarity.

A particularly useful application of cluster vias occurs in panel circuits, where there typically arises the need to connect signal channels lying on opposite sides of the PPW power distribution system. This is normally accomplished by passing signal vias vertically through apertures in the PPW conducting planes. Where a periodic array of resonant vias has been implemented as a stop band filter, signal vias can be passed either through the resonant via pads, or in between them. In either case, the signal vias are susceptible to electromagnetic coupling with residual fields propagating along the PPW structure. Presented in FIG. 24 are plan and elevation section views of two typical resonant vias within a periodic array. In addition to the resonant vias is shown a typical implementation of a signal via (2401) that could be utilized as a transmission channel to traverse the PPW power distribution planes. Electrical isolation of the signal via penetrations can be improved by routing them inside a ring of via clusters, which because of their coupling path to ground, act as an RF shield. FIG. 25 presents an exemplary alternative embodiment of a resonant via wherein the single annular via of FIG. 24 has been replaced by a cluster of six smaller diameter vias (2502) that are otherwise coupled at their ends as for the singular via of FIG. 23. FIG. 26 is a perspective view of the signal and cluster vias of FIG. 25, with the dielectric and metal layers removed for clarity. Although the number, spacing, and form of the cluster may be varied, it will be recognized that the electromagnetic resonance response of the resonant cluster via of FIG. 25 is determined by the combined inductance of the cluster of vias as compared with the single via of FIG. 24. Thus, for example, the resonant characteristics of the topology of FIG. 25 can be made equal to that of FIG. 24 through an appropriate choice of the number, diameter, and spacing of the vias in the cluster.

Figure 27:
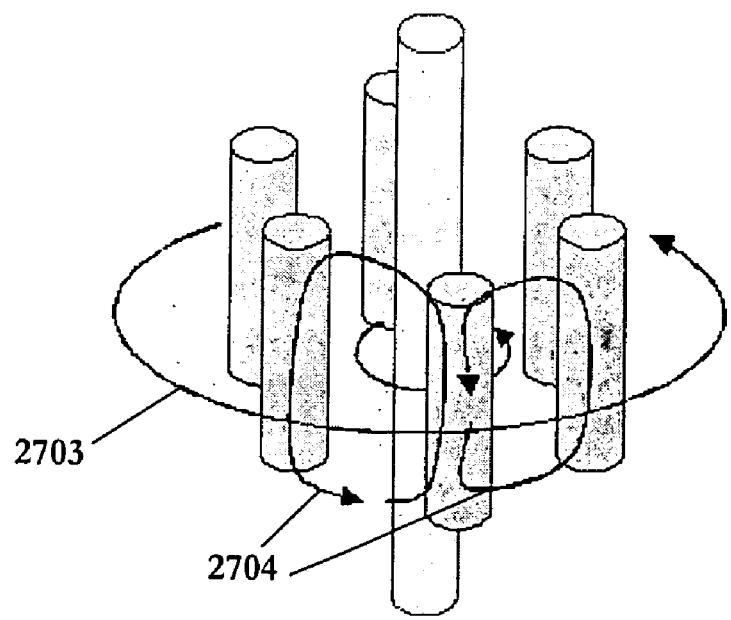
FIG. 27 presents the perspective view of FIG. 26 showing the currents set up in the conducting loops formed by the cluster via that tend to exclude RF field penetration into the interior.

A salient feature of the topology of FIG. 25, compared to one comprising an equivalent singular via, lies in the ability to route the signal via (2501) within the substantially field-free region inside the cluster, thereby implementing an additional level of isolation relative to the electromagnetic waves propagating within the PPW structure of the power plane. The fact that closed conducting loops are formed by individual vias in the cluster is a key concept to enforce the isolation of magnetic flux lines. Depicted in FIG. 27 is the interaction of an external RF field (2703) with a single resonant cluster via whereby diamagnetic current loops (2704) are excited that impede penetration of the external RF field into the interior of the cluster. Only the vias are illustrated in this view and the planar metal layers that complete the current loops are omitted for clarity. Configuring a cluster via in the form of a circle or similar geometry that encloses an interior area, an essentially field-free region or so-called Faraday cage is formed that isolates internally routed signal vias from external electromagnetic fields over a very wide frequency band.

A fundamental aspect of a signal transmission line is its line impedance. Of particular concern in the present context is matching the signal via line impedance to the signal lines it connects. It will be recognized that the line impedance of the signal via is directly related to the configuration of the cluster via within which it passes. More particularly, the line impedance is related to the ratio of signal via to cluster via diameters. Thus, the cluster via can be configured such that the line impedance of the signal via is matched to the signal transmission line it connects. Because of the several degrees of freedom in the problem, including the diameter, number, and spacing of the vias, this does not necessarily preclude the cluster via from simultaneously having a particular inductance in relation to the preferred resonant frequency of the resonant cluster in addition to matching the signal line impedance. Any or all of the plurality of resonant vias in a periodic array may consist of cluster vias and one or more signal vias can be routed within a single cluster via. Such signal vias may be either balanced lines or unbalanced lines. In other implementations of a periodic array of resonant vias, the diameter of the vias in a cluster topology required to match that of the preferred single via embodiment may be limited by physical constraints that render matching of the resonance frequencies impracticable. Nevertheless, even in this circumstance it may still be advantageous to utilize the cluster of vias topology for those relatively few resonant vias where penetration is required because of the added layer of isolation it provides while not significantly altering the stop band characteristics of the periodic array as a whole.

While certain embodiments of the inventions have been described above, it should be understood that the particular embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed:

1. A cluster resonator, comprising:
   a first conducting plane;
   a second substantially parallel conducting plane;
   a cluster of vias of essentially uniform length oriented substantially normal to the conducting planes each via in the cluster comprising a first end and a second end;
   a first conducting pad disposed in a third plane substantially parallel and capacitively coupled to the first conducting plane and physically coupled with the vias of the cluster of vias proximate their first ends; and
   a second conducting pad disposed in a fourth plane substantially parallel and capacitively coupled to the second conducting plane and physically coupled with the vias of the cluster of vias proximate their second ends, wherein the vias are physically connected to only the first and second conducting pads; and wherein a combined inductance and capacitance of the cluster of vias form an electromagnetically resonant shunt circuit between the first and second conducting planes; and wherein the vias of the cluster of vias are disposed along a perimeter that defines an interior region and one or more interior vias are routed within the interior region of the cluster of vias; and wherein the interior vias comprise portions of transmission lines passing electrical signals through the cluster resonator.

2. A cluster resonator, comprising:

a first conducting plane;

a second substantially parallel conducting plane;

a cluster of vias of essentially uniform length oriented substantially normal to the conducting planes, each via in the cluster comprising a first end and a second end;

a first conducting pad disposed in a third plane substantially parallel and capacitively coupled to the first conducting plane and physically coupled with the vias of the cluster of vias proximate their first ends; and a second conducting pad disposed in a fourth plane substantially parallel and capacitively coupled to the second conducting plane and physically coupled with the vias of the cluster of vias proximate their second ends, wherein the vias are physically connected to only the first and second conducting pads; and wherein the first or second conducting pad is external relative to the first and second conducting planes.

3. The cluster resonator of claim 1, wherein the first or second conducting pad is internal relative to the first and second conducting planes.

4. The cluster resonator of claim 1, wherein the first and second conducting pads are internal relative to the first and second conducting planes.

5. The cluster resonator of claim 1, wherein the first and second conducting pads are external relative to the first and second conducting planes.

6. The cluster resonator of claim 1 or 2, wherein its topology comprises a mechanically balanced structure.

7. The cluster resonator of claim 1 or 2, wherein the first and second conducting planes are metallic layers incorporated with a multi-layered panel circuit.

8. The cluster resonator of claim 7, wherein the multi-layered panel circuit is a multi-layered printed circuit board and the cluster resonator comprises an array of plated through holes.

9. The cluster resonator of claim 7, wherein the multi-layered panel circuit is a multi-chip module.

10. The cluster resonator of claim 7, wherein the multi-layered panel circuit is a semiconductor chip.

11. The cluster resonator of claim 1, wherein the cluster of vias is disposed along a circular path.

12. The cluster resonator of claim 1, wherein the cluster of vias is disposed along an elliptical path.

13. The cluster resonator of claim 1, wherein the cluster of vias is disposed along a polygonal path.

14. The cluster resonator of claim 1, wherein spacing of vias within the cluster of vias effects a Faraday cage that substantially shields the interior region from RF fields propagating within the first and second conducting planes.

15. The cluster resonator of claim 14, wherein spacing of the vias within the cluster of vias in relation to the interior vias effects a predetermined line impedance in the interior vias.

16. A cluster resonator, comprising:

a first conducting plane;

a second substantially parallel conducting plane;

a cluster of vias of essentially uniform length oriented substantially normal to the conducting planes, each via in the cluster comprising a first end and a second end;

first ends of each via in the cluster of vias coupled with the first conducting plane; and a first conducting pad disposed in a third plane parallel and external to the region between the first and second conducting planes and capacitively coupled to the second conducting plane and physically coupled to each via in the cluster of vias proximate their second ends, wherein the vias in the cluster of vias are physically connected to only the first conducting plane and the first conducting pad.

17. The cluster resonator of claim 16, wherein a combined inductance and capacitance of the cluster of vias form an electromagnetically resonant shunt circuit between the first and second conducting planes.

18. The cluster resonator of claim 16, wherein the vias of the cluster of vias are disposed along a perimeter that defines an interior region.

19. The cluster resonator of claim 18, wherein one or more interior vias are routed within the internal region of the cluster of vias.

20. The cluster resonator of claim 19, wherein the interior vias comprise portions of transmission lines passing electrical signals through the resonant element.

21. The cluster resonator of claim 16 comprising a second cluster of vias, each via in the second cluster of vias comprising a first end and a second end, wherein the vias in the second cluster of vias are coupled proximate their first ends to the second conducting plane and proximate their second ends to a second conducting pad disposed in a fourth plane parallel and external to the region between the first and second conducting planes and capacitively coupled to the first conducting plane, wherein the vias in the cluster of vias are physically connected to only the second conducting plane and the second conducting pad.

22. The cluster resonator of claim 21 wherein its topology comprises a mechanically balanced structure.

23. The cluster resonator of claim 16, wherein the first and second conducting planes are metallic layers incorporated with a multi-layered panel circuit.

24. The cluster resonator of claim 23, wherein the multi-layered panel circuit is a multi-layered printed circuit board and the cluster resonator comprises an array of plated through holes.

25. The cluster resonator of claim 16, wherein the multi-layered panel circuit is a multi-chip module.

26. The cluster resonator of claim 16, wherein the multi-layered panel circuit is a semiconductor chip.

27. The cluster resonator of claim 18, wherein the cluster of vias is disposed along a circular path.

28. The cluster resonator of claim 18, wherein the cluster of vias is disposed along an elliptical path.

29. The cluster resonator of claim 18 wherein the cluster of vias is disposed along a polygonal path.

30. The cluster resonator of claim 19, wherein spacing of the vias of the cluster of vias effects a Faraday cage that substantially shields the interior region from RF fields propagating within the first and second conducting planes.

31. The cluster resonator of claim 30, wherein spacing of the vias of the cluster of vias in relation to the interior vias effects a predetermined line impedance in the interior vias.

32. The cluster resonator of claims 1 or 6, further comprising a plurality of resonant vias and associated first and second conducting pads disposed in a periodic array associated with the first and second conducting planes.

33. The cluster resonator of claim 16, further comprising a plurality of resonant vias and associated first conducting pads disposed in a periodic array associated with the first and second conducting planes.

34. The cluster resonator of claims 1 or 6, wherein a diameter of the vias of the cluster of vias is selected to effect a predetermined inductance.

35. The cluster resonator of claim 16, wherein a diameter of the vias of the cluster of vias is selected to effect a predetermined inductance.

36. A cluster resonator comprising:
  a first conducting plane;
  a second substantially parallel conducting plane;
  a first conducting pad disposed in a third substantially parallel plane internal to the region between the first and second conducting planes;
  a first cluster of vias oriented substantially normal to the first conducting plane and first conducting pad and disposed therebetween, each via of the cluster having a first end and a second end, wherein the first and second ends are physically connected respectively to the first conducting plane and first conducting pad; and
  a second conducting pad disposed in a fourth substantially parallel plane internal to the region between the first and second conducting planes;
  a second cluster of vias oriented substantially normal to the second conducting plane and second conducting pad and disposed therebetween, each via of the cluster having a first end and a second end, wherein the first and second ends are physically connected respectively to the second conducting plane and second conducting pad; and
  wherein the first and second conducting pads are proximate and capacitively coupled to each other; and
  wherein the vias of the clusters of vias are disposed along a common perimeter thereby forming substantially field free interior regions therewithin; and
  wherein one or more electrically isolated interior vias traverse the interior regions of the clusters of vias, the interior vias comprising portions of transmission lines for passing electrical signals therethrough.

37. The cluster resonator of claim 36, wherein a spacing of the vias of the clusters of vias in relation to the interior vias is selected to effect a predetermined line impedance in the interior vias.

38. The cluster resonator of claim 36, wherein a diameter of the vias of the clusters of vias is selected to effect a predetermined inductance.

39. The cluster resonator of claim 36, wherein the common perimeter is circular.

40. The cluster resonator of claim 36, wherein the common perimeter is elliptical.

41. The cluster resonator of claim 36, wherein the common perimeter is polygonal.

42. The cluster resonator of claim 36, wherein the first and second conducting planes are metallic layers incorporated within a multi-layered panel circuit.

43. The cluster resonator of claim 42, wherein the multi-layered panel circuit is a multi-layered printed circuit board and the cluster resonator comprises an array of plated through holes.

44. The cluster resonator of claim 42, wherein the multi-layered panel circuit is a multi-chip module.

45. The cluster resonator of claim 42, wherein the multi-layered panel circuit is a semiconductor chip.

* * * * *